United States Patent [19]
Brenneman et al.

[11] Patent Number: 5,872,712
[45] Date of Patent: Feb. 16, 1999

[54] METHOD AND APPARATUS FOR AUDIBLY INDICATING WHEN A PREDETERMINED LOCATION HAS BEEN ENCOUNTERED IN STORED DATA

[75] Inventors: Scott A. Brenneman, Menlo Park, Calif.; Timothy Mott, Ketchum, Id.; Leon D. Segal, Menlo Park, Calif.

[73] Assignee: Audible, Inc., Wayne, N.J.

[21] Appl. No.: 874,413

[22] Filed: Jun. 13, 1997

[51] Int. Cl.$^6$ .............................. G05B 19/42; G11B 17/22
[52] U.S. Cl. ................................. 364/193; 369/32; 369/98
[58] Field of Search ................................ 364/193; 369/32, 369/33, 96, 98

[56] References Cited

U.S. PATENT DOCUMENTS

| | | | |
|---|---|---|---|
| 4,499,568 | 2/1985 | Gremillet | 369/30 |
| 4,682,368 | 7/1987 | Takahashi | 455/38 |
| 4,698,776 | 10/1987 | Shibata | 364/513.5 |
| 4,725,977 | 2/1988 | Izumi et al. | 364/900 |
| 4,772,873 | 9/1988 | Duncan | 341/110 |
| 4,851,931 | 7/1989 | Parker et al. | 360/15 |
| 4,989,179 | 1/1991 | Simko | 365/45 |
| 5,008,872 | 4/1991 | Tomoda et al. | 369/32 |
| 5,042,070 | 8/1991 | Linna et al. | 381/59 |
| 5,099,422 | 3/1992 | Foresman et al. | 364/401 |
| 5,249,166 | 9/1993 | Hamilton et al. | 369/32 |
| 5,359,698 | 10/1994 | Goldberg et al. | 395/2.1 |
| 5,365,502 | 11/1994 | Misono | 369/18 |
| 5,463,601 | 10/1995 | Yanagisawa | 369/32 |
| 5,491,774 | 2/1996 | Norris et al. | 395/2.79 |
| 5,499,221 | 3/1996 | Ito et al. | 369/32 |
| 5,524,051 | 6/1996 | Ryan | 380/9 |
| 5,541,638 | 7/1996 | Story | 348/7 |
| 5,557,541 | 9/1996 | Schulhoh et al. | 364/514 R |
| 5,572,442 | 11/1996 | Schulhoh et al. | 364/514 C |

OTHER PUBLICATIONS

"PC Today Features News Article on Information Highway Media Corporation", 1 pg., 76 PC Today , Jan. 1985.
"Aural Hygiene ", 1 pg., AutoWeek (No Date).
"Listen Up audio system and Audio on Demand", 1 pg., Electronic Entertainment (No Date).
"The Captive Audience Network", 1 pg. Popular Science, Feb. 1995.
"Silicon Valley Start–up to Create New On–ramp to the Information Superhighway with its Listen–Up Audio System and Audio–On–Demand Subscription Service", 3 pp., Information .
"Information Highway Media Corp. Retains Von Gehr International As Investment Banker", 1 pg., Information Highway Media Corporation (No Date).

*Primary Examiner*—Paul P. Gordon
*Attorney, Agent, or Firm*—Blakely, Sokoloff, Taylor & Zafman LLP

[57] ABSTRACT

A method and apparatus for audibly indicating when a predetermined location has been encountered in stored data is disclosed. A predetermined location is first identified. An audible indicator associated with the predetermined location is then generated when the predetermined location is encountered. The predetermined location can be an electronic bookmark, a section boundary or a program boundary. The invention includes a method and apparatus for audibly setting an electronic bookmark in stored data by selecting a location within the stored data, associating an electronic bookmark with the location, and generating an audible message for the electronic bookmark.

6 Claims, 8 Drawing Sheets

| offset | size | Flash Header | |
|---|---|---|---|
| 0 | 4 | sig | Flash header signature |
| 4 | 4 | blockList | Block list for data structure |
| 8 | 4 | numBytes | Total number of bytes for data structures |
| 12 | 4 | progPtr | Pointer to audio program headers |
| 16 | 4 | apPtr | Pointer to audio prompt table |
| 20 | 4 | algPtr | Pointer to audio prompt table |
| 24 | 4 | spare1 | |
| 28 | 4 | spare2 | |
| 32 | 4 | spare3 | |
| 36 | 4 | spare4 | |

FIG. 5

| offset | size | Audio Prompt Table | |
|---|---|---|---|
| 0 | 2 | numAP | Number of Audio Prompts in Table |
| 2 | 2 | ApID1 | ID for Audio Prompt 1 |
| 4 | 42 | apAudioDesc1 | Audio descriptor for audio Prompt 1 |
| 46 | 2 | apID2 | ID for Audio Prompt 2 |
| 48 | 42 | apAudioDesc2 | |
| 2 + 44(n-1) | 2 | apIDn | ID for Audio Prompt n |
| 2 + 44(n-1) +2 42 | 42 | apAudioDescn | Audio descriptor for audio Prompt n |

| offset | size | Audio Descriptor | |
|---|---|---|---|
| 0 | 4 | blocklist | Pointer to audio block list |
| 4 | 4 | numBytes | Total number of bytes for audio |
| 8 | 4 | tmLength | Length of time of audio in 10mS increments |
| 12 | 2 | compVersion | Compression algorithm version |
| 14 | 4 | timeStamps | Offset to timestamp table |
| 18 | 4 | spare1 | |
| 22 | 4 | spare2 | |

FIG. 7

METHOD AND APPARATUS FOR AUDIBLY INDICATING WHEN A PREDETERMINED LOCATION HAS BEEN ENCOUNTERED IN STORED DATA

FIELD OF THE INVENTION

The present invention relates generally to audio information playback systems. Specifically, the present invention pertains to a method and apparatus for audibly indicating when a predetermined location has been encountered in stored data.

DESCRIPTION OF RELATED ART

Digital information playback systems today include systems such as cassette and compact disk (CD) players. These types of systems are becoming increasingly popular as growing numbers of products and services emerge to cater to this market. One example of an emerging market for digital information playback systems is the "book-on-tape" product market. With a book-on-tape, a commuter, for example, can audibly "read," or more accurately listen to, a book while commuting to work. The commuter simply inserts the cassette tape or the CD into a cassette deck or CD player and listens to the audio version of the tape. All the functionality of the cassette deck or CD player is available to the commuter.

Figure 1:
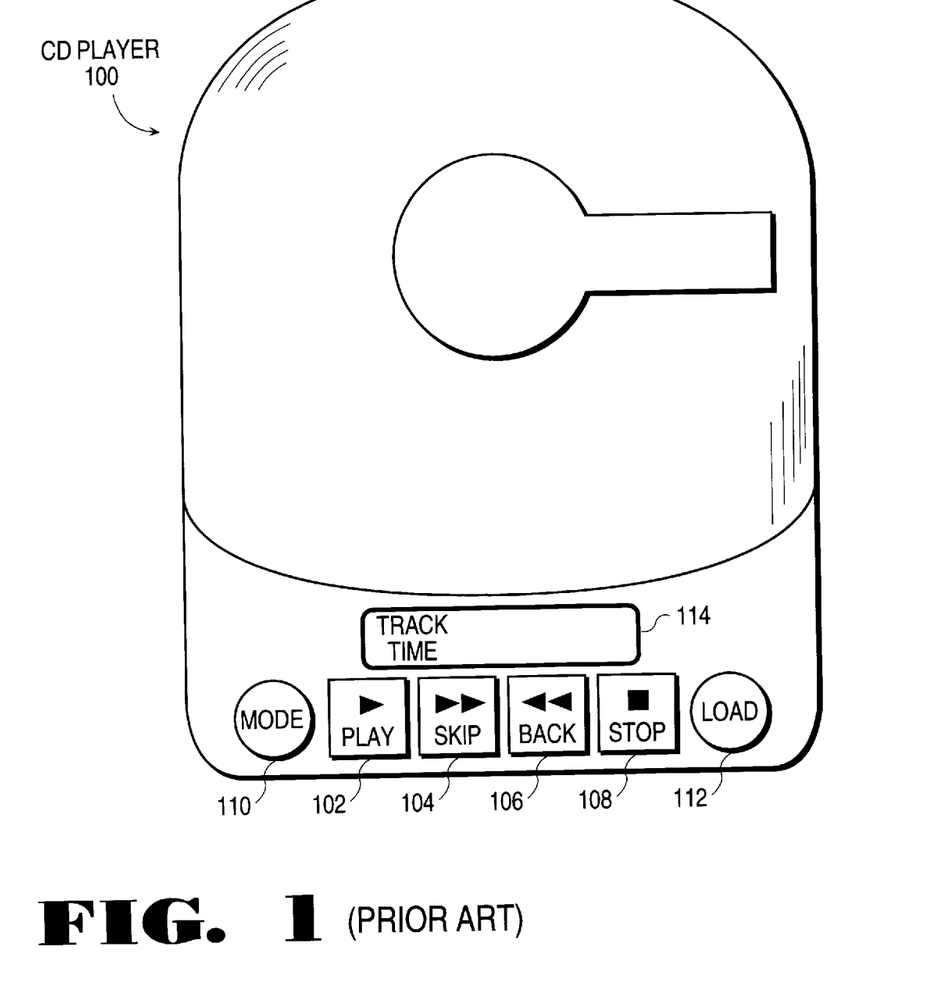
FIG. 1 illustrates a prior art CD player.

FIG. 1 illustrates a prior art CD player that allows a user to playback recorded audio data such as a book-on-tape. As illustrated, CD player 100 includes numerous buttons that correspond to a variety of functions. For example, PLAY button 102 allows a user to begin playing of the content on the audio CD inserted in CD player 100 and STOP button 108 allows the user to stop listening to the played audio. Similarly, the SKIP button 104 allows a user to skip forward through tracks on the CD, while the BACK button 106 allows a user to rewind or skip backwards on a CD. MODE button 110 allows the user to specify specific modes of execution, for example "continuous play." LOAD button 112 allows a user to specify a track to be loaded for execution. Finally, TRACK TIME button 114 allows a user to visually determine which track is currently executing and how long the track is.

These functions are not, however, necessarily optimized for a conventional book-on-tape product. For example, the prior art CD player in FIG. 1 lacks the ability to audibly inform the user of various actions. When a user skips forward a number of tracks on the CD player, the user is unaware of the track at which the read mechanism of the CD player is currently located unless the user visually observes the track movement or stops the skipping to listen to the current audio track. This limitation can prove to be a problem in a portable system wherein the user may wish to perform a number of functions, be aware of the functions being performed, but not wish to or be able to visually monitor the player at all times.

Additionally, in the conventional book-on-tape example, if the user decides to stop reading (i.e., listening) at a certain point, there is no ability in any current system to place an electronic "bookmark" to identify a location in the content on a digital information playback system, similar to how a user would physically place a bookmark in a conventional book.

It is therefore desirable to provide a method and apparatus for audibly indicating when a predetermined location has been encountered in stored data. A user should be able to navigate through stored audio data and receive audible feedback of predetermined data locations. Audible navigation would allow a user to navigate without constantly having to visually monitor the playback device.

SUMMARY OF THE INVENTION

The present invention discloses a method and apparatus for audibly indicating when a predetermined location has been encountered in stored data. A predetermined boundary is first identified. An audible indicator associated with the predetermined location is then generated when the predetermined location is encountered.

Other objects, features and advantages of the present invention will be apparent from the accompanying drawings and from the detailed description.

BRIEF DESCRIPTION OF THE DRAWINGS

The present invention is illustrated in the following drawings, in which known circuits are shown in block-diagram form for clarity. These drawings are for explanation and for aiding the reader's understanding. The present invention should not be taken as being limited to the preferred embodiments and design alternatives illustrated.

DETAILED DESCRIPTION OF THE PREFERRED EMBODIMENT

The present invention relates to a method and apparatus for audibly indicating when a predetermined location has been encountered in stored data. "Stored data" in the context of the present invention refers to any type of stored audible data, including digitized and/or compressed audio data. In the following detailed description, numerous specific details are set forth in order to provide a thorough understanding of the present invention. It will be apparent to one of ordinary skill in the art, however, that these specific details need not be used to practice the present invention. In other instances, well-known structures, interfaces and processes have not been shown in detail in order not to unnecessarily obscure the present invention.

Figure 2:
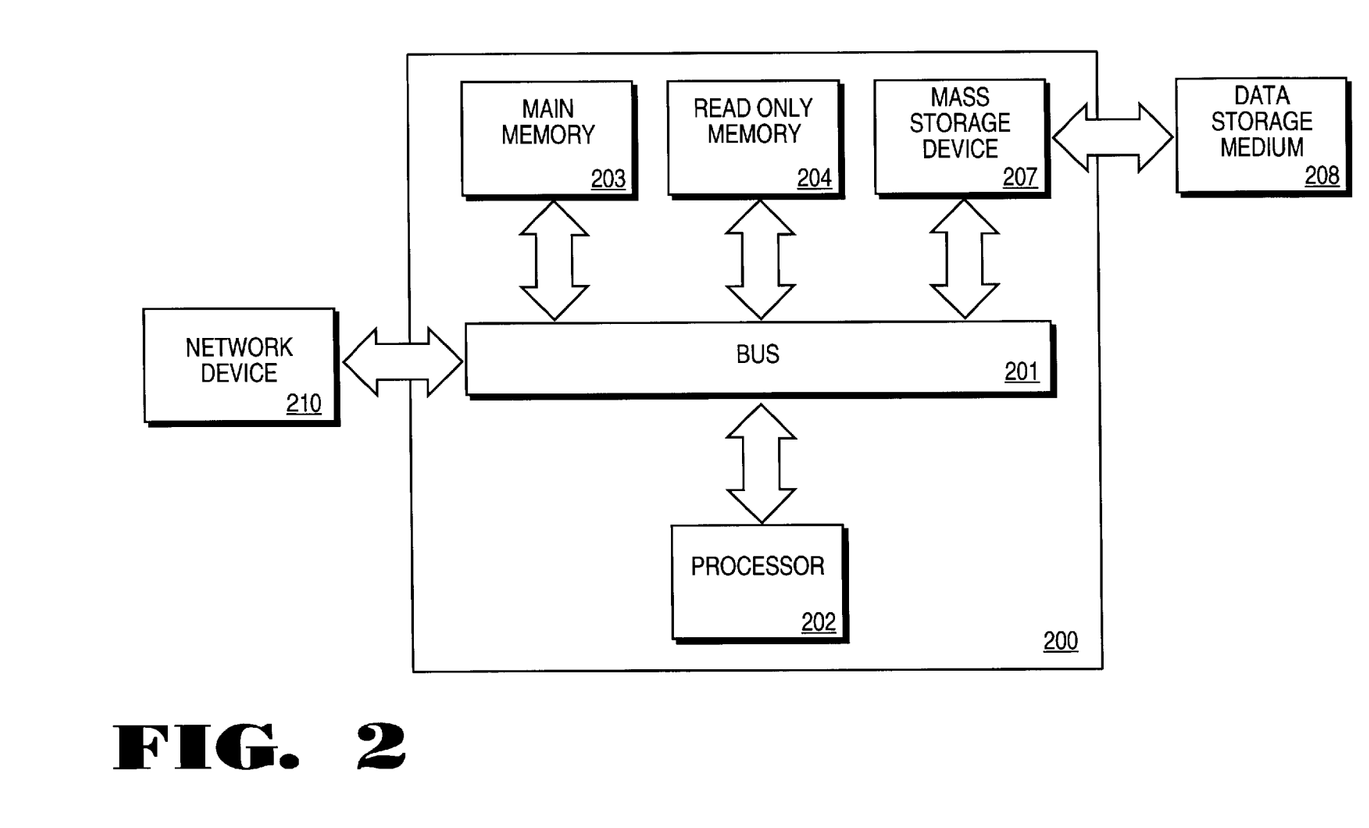
FIG. 2 illustrates a typical system within which one embodiment of the present invention may be practiced.

FIG. 2 illustrates a system 200 in which the present invention operates. It will be apparent to those of ordinary skill in the art that alternative architectures may also be employed. In general, the system comprises a bus 201 for communicating information, a processor 202 coupled with the bus 201 for processing information, main memory 203 coupled with the bus 201 for storing information and instructions for the processor 202, a read-only memory 204 coupled with the bus 201 for storing static information and instructions for the processor 202, and a mass storage device 207, such as a magnetic disk and associated disk drive, coupled with the bus 201 for storing information and instructions. A data storage medium 208 containing digital information is configured to operate with mass storage device 207 to allow processor 202 access to the digital information on data storage medium 208 via bus 201.

Processor 202 may be any of a wide variety of general purpose processors or microprocessors. Mass storage device 207 may be a conventional hard disk drive, floppy disk drive, CD-ROM drive, or other magnetic or optical data storage device for reading and writing information stored on a hard disk, a floppy disk, a CD-ROM a magnetic tape, or other magnetic or optical data storage medium. Data storage medium 208 may be a hard disk, a floppy disk, a CD-ROM, a magnetic tape, or other magnetic or optical data storage medium.

In general, processor 202 retrieves processing instructions and data from a data storage medium 208 using mass storage device 207 and downloads this information into random access memory 203 for execution. Processor 202, then executes an instruction stream from random access memory 203 or read-only memory 204.

Figure 3:
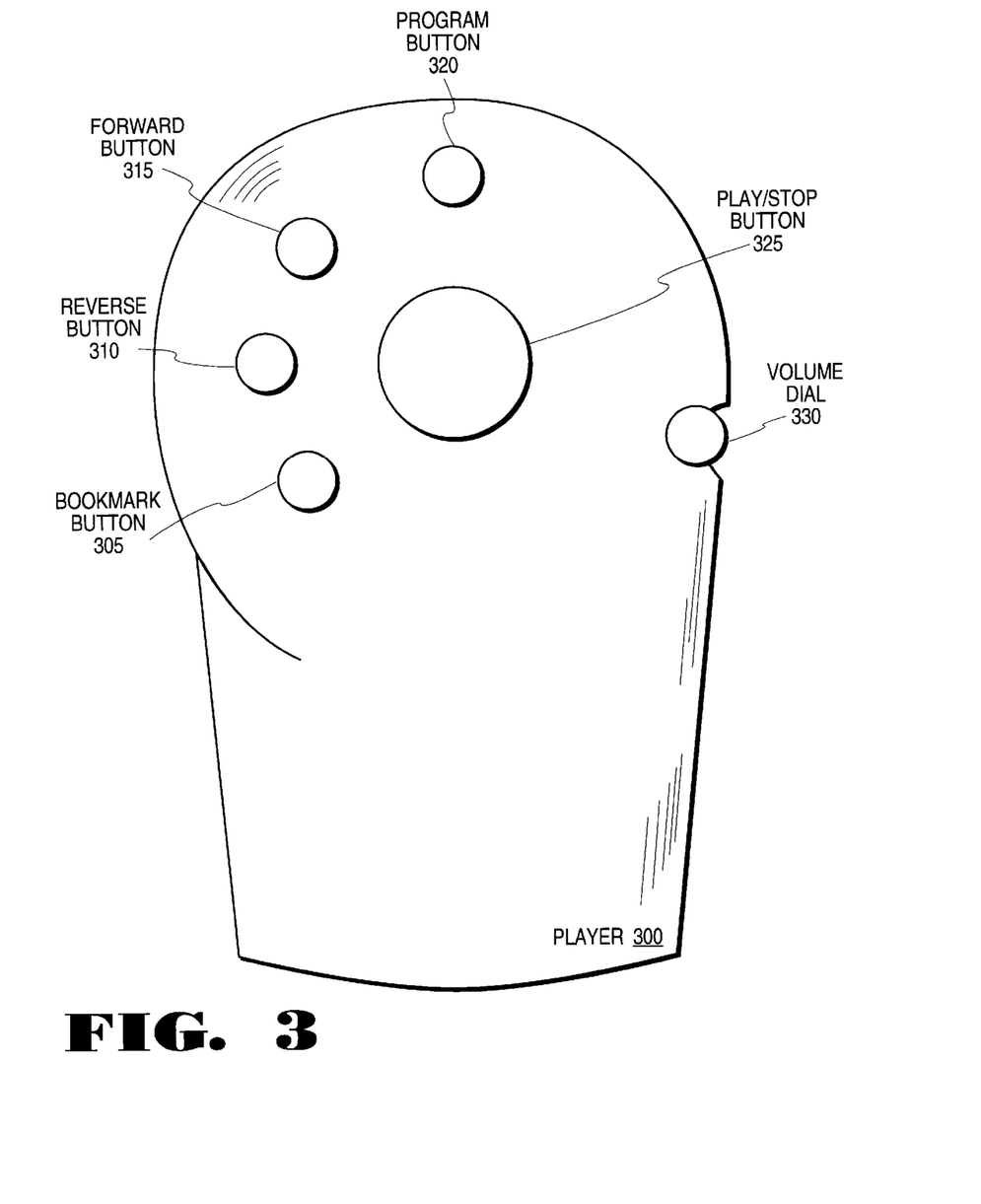
FIG. 3 illustrates an alternative system within which one embodiment of the present invention may be practiced.

FIG. 3 illustrates an alternative system on which one embodiment of the present invention operates. Player 300 is a mobile playback device that allows digitized audio content to be downloaded to the player, and later replayed. A user can utilize the buttons on player 300 to audibly navigate through stored data according to the following embodiments of the present invention. Player 300 includes buttons 305, 310, 315, 320 and 325 and volume dial 330. Further details of player 300 can be found in related patent application Ser. No. 08/710,114, filed on Sep. 12, 1996. In summary, player 300 includes a processor containing internal Random Access Memory (RAM). External to the processor are conventional Read-Only Memory (ROM) and a memory storage device such as Flash memory. The ROM contains the operating software, while the Flash memory (or other memory storage device) contains audio data. The following description of one embodiment of the present invention is based on this alternative system utilizing player 300. The following description may, however, also be modified for the computer system 200 described above.

According to one embodiment, audio prompts are played when predetermined locations in the stored data are encountered. These audio prompts indicate a variety of information, including end of all audio, beginning of a program, end of a program and beginning of a section. Users can also add their own temporary pointers anywhere in the content with audio prompts associated with these temporary pointers. These temporary pointers are known as "bookmarks" and are illustrated by bookmark 1 and bookmark 2 in FIG. 4. The number of bookmarks that a user can set may be limited to a predetermined number. Bookmarks are described in further detail below.

Figure 4:
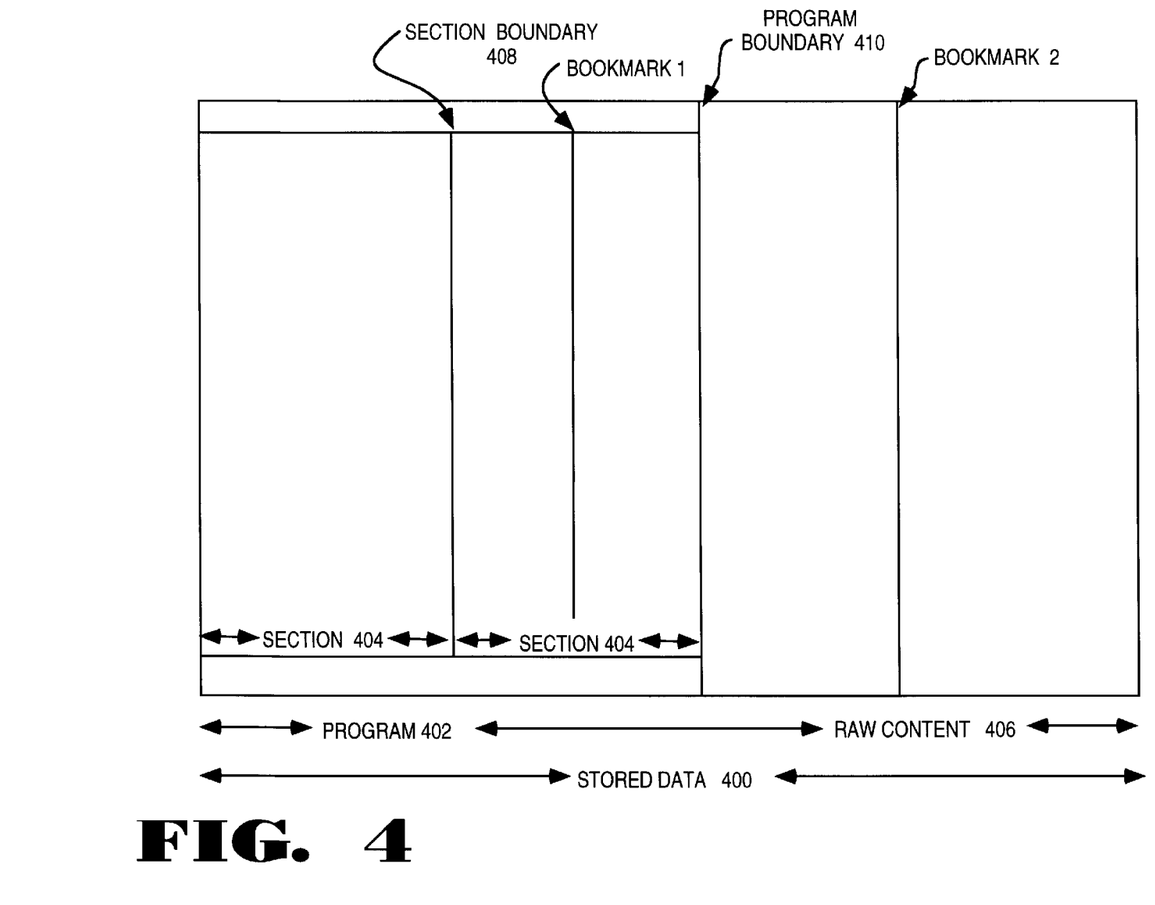
FIG. 4 illustrates the an example of one embodiment of the present invention.

According to one embodiment, as illustrated in FIG. 4, the present invention recognizes three levels of hierarchy in stored data 400, namely programs 402 (e.g. books), sections 404 (e.g. chapters), and raw (low-level, undifferentiated) content 406. Some programs will lack segmentation, and others may have subsections. As illustrated, program 402 has two sections (403 and 404), with section boundary 408. Program 402 ends at program boundary 410. Programs that lack sections will be structurally indistinguishable from raw content. The programs and sections are reachable by jumps requested by the user via single clicks of the forward, rewind or program buttons, for example, while raw content is traversed in a direct, but accelerated fashion. Jumps are described in further detail below. As predetermined locations (programs, sections, bookmarks, etc.) are encountered in the stored data, audio prompts associated with the predetermined locations are generated. The functionality of the audio prompts is described in further detail below.

According to one embodiment, two data structures, namely Program Headers and Table of Content (TOC) nodes, are utilized to jump to programs and sections. Program Headers are linked together in a linked list. A Program Header has associated with it a linked list of one or more TOC nodes. A section jump is equivalent to using a different TOC node. A program jump is equivalent to using a different Program Header. Locations within the audio data are detected via a virtual file system that is based on the current Program Header and TOC node. The list in the audio descriptor in the TOC node is used to describe the virtual file stored in flash. A logical file position is created using these data structures.

Figure 5:
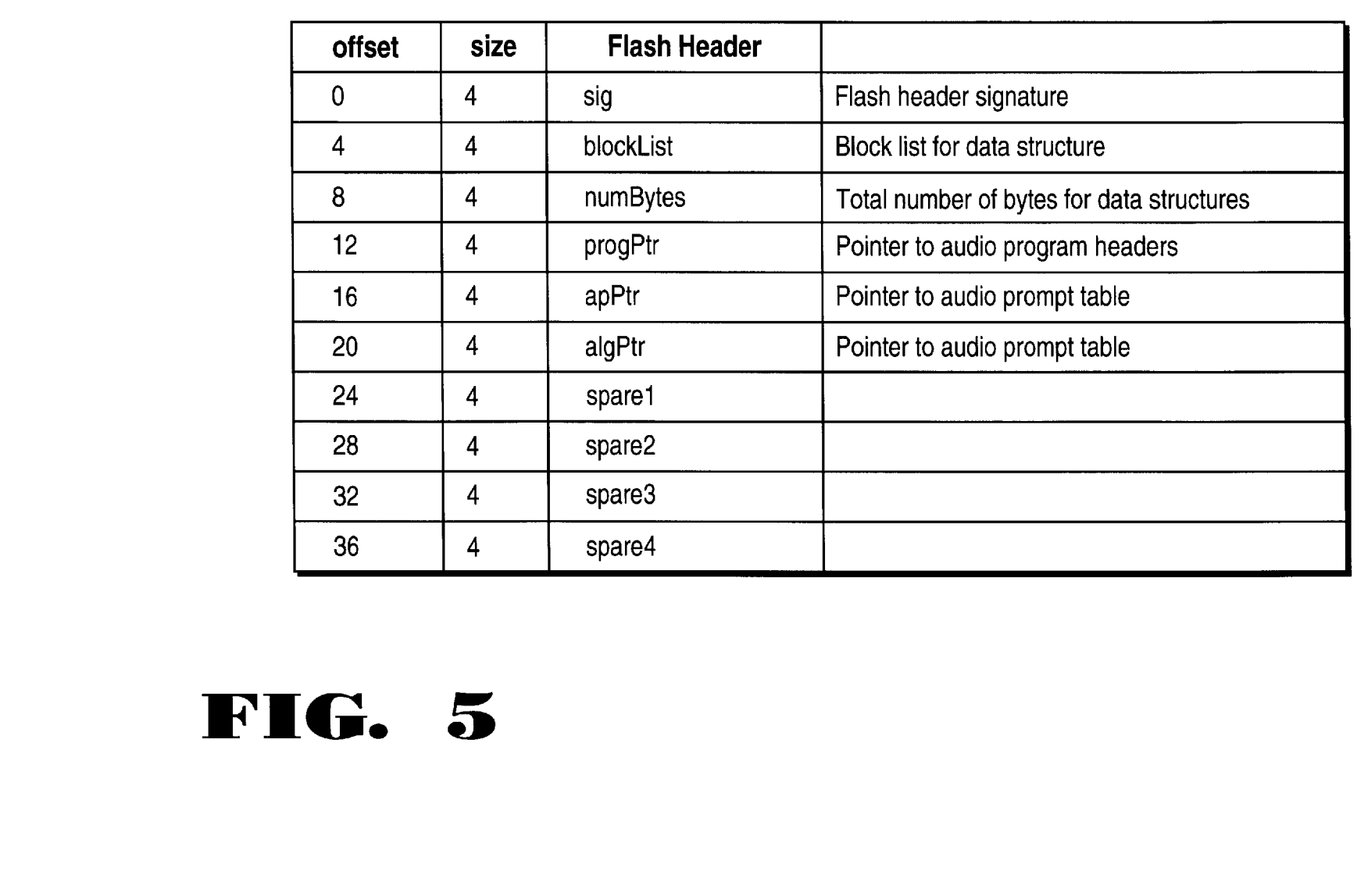
FIG. 5 illustrates a Flash header data structure according to one embodiment of the present invention.

According to one embodiment of the present invention, data structures are indexed by a header data structure that may be found at the beginning of the first valid block of data storage medium. The following sections refer to Flash memory as the data storage medium of one embodiment. Other data storage media may also be utilized according to alternative embodiments of the present invention. The Flash header data structure of one embodiment of the present invention is illustrated in Flash Header Table 500 in FIG. 5. The offset in FIG. 5 (and in following FIGS. 6 and 7) represents the byte offset for each field in each structure.

One data structure which is indexed in the Flash header is the audio prompt table. According to one embodiment, all audio prompts are accessed through the audio prompt table. The audio prompt table consists of audio prompt entries. Each audio prompt entry consists of an ID number and a generic audio descriptor. The audio prompt table data structure of one embodiment of the present invention is illustrated in Audio Prompt Table 600 in FIG. 6A. The ID number is a unique ID for each audio prompt. The IDs need only be unique for each Flash image and do not need to be unique throughout the set of all audio prompts. According to one embodiment, the ID numbers 0 to 1,023 are reserved for system use (i.e. for system audio prompts). All other IDs may be freely assigned. When a prompt is requested or identified, the prompt is looked up in Audio Prompt Table 600 of FIG. 6A. The ID number of the prompt request is matched with the apID<n> and if a prompt is found, that prompt is played. Otherwise, execution continues without a prompt.

Figure 6A:
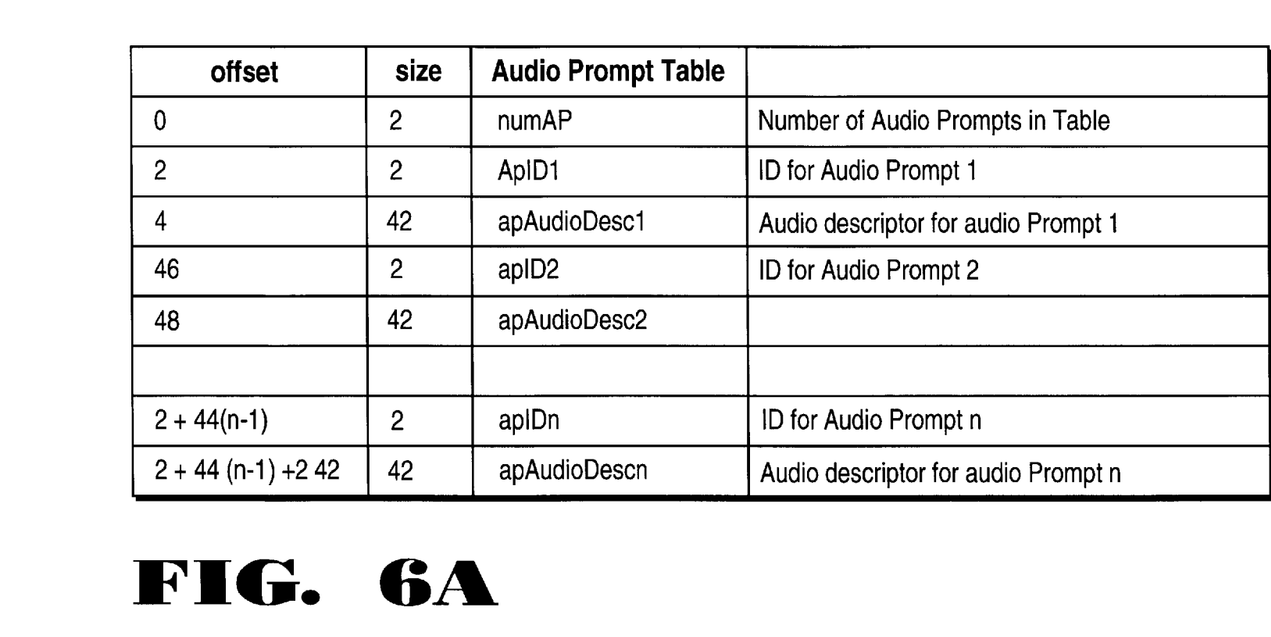
FIG. 6A illustrates an audio prompt table data structure according to one embodiment of the present invention.
Figure 6B:
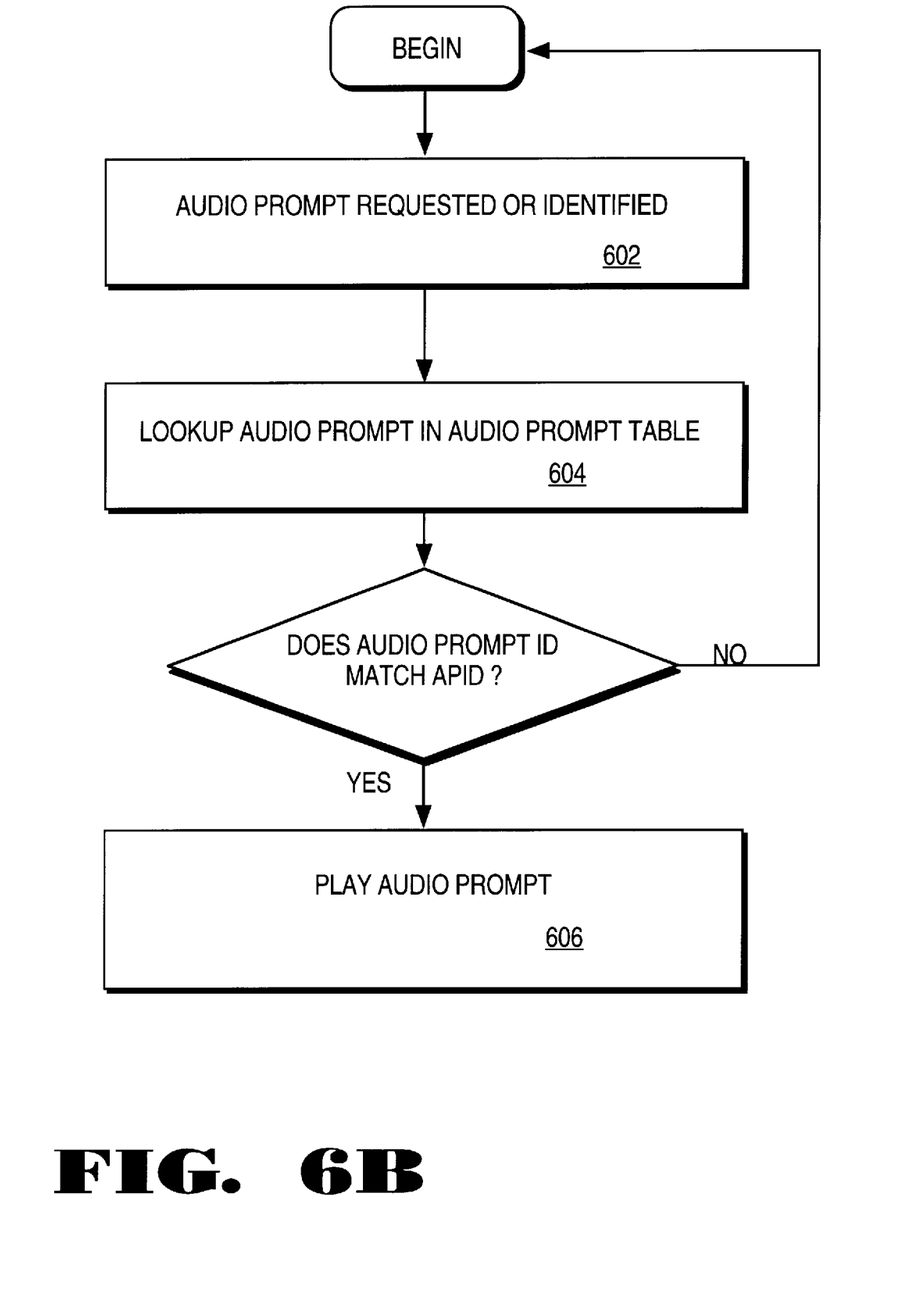
FIG. 6B is a flow chart according to one embodiment of the present invention.
Figure 7:
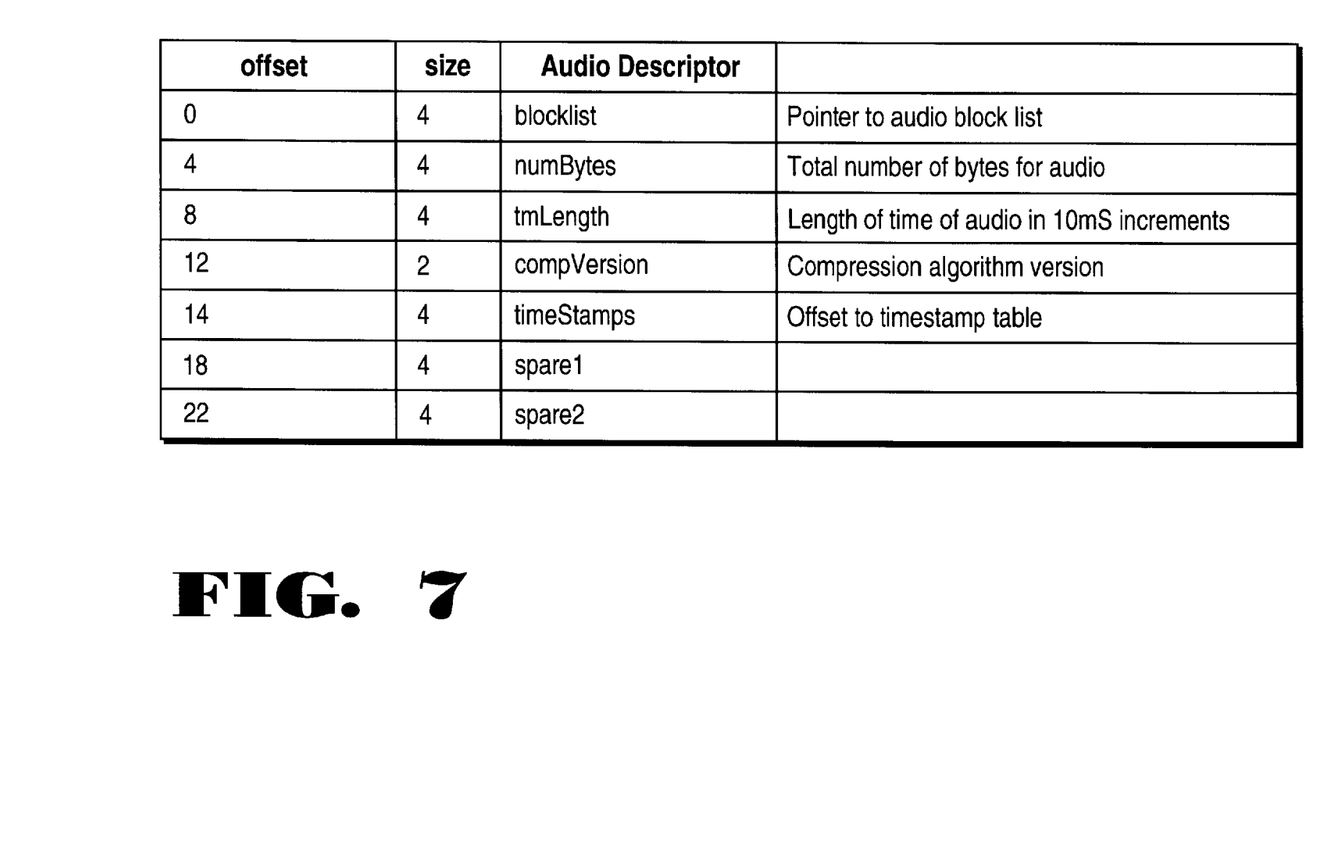
FIG. 7 illustrates an audio descriptor data structure according to one embodiment of the present invention.

FIG. 6B is a flow chart illustrating this embodiment of the presently claimed invention. As illustrated, in step 602, an prompt is requested or identified. The audio prompt is then looked up in an audio prompt table in step 604. If the audio prompt ID matches an apID in the audio prompt table, then the audio prompt is played in step 606. Otherwise, the execution continues without a prompt.

The generic audio descriptor is a data structure that describes audio in general terms: length of audio time, a linked list data structure to locate audio in the Flash, and a compression algorithm ID. The audio descriptor data structure of one embodiment of the present invention is illustrated in Audio Descriptor Table 700 in FIG. 7. Some audio prompts may be expressed with a single ID (e.g., a title prompt consisting of all the words which make up the title). Other audio prompts may be composed of multiple IDs (e.g., the status prompt, see below).

According to one embodiment, program and section boundaries are implemented using program header data structures and their associated TOC node data structures. A Program Header corresponds to program 402. A TOC node corresponds to a section 404 within program 402. Each TOC node has some audio data associated with it. When the software runs out of audio to play, more audio data is retrieved. Moving from one TOC node to the next represents a section boundary crossing. Moving from one program header to the next represents a program boundary crossing.

According to one embodiment of the present invention, there are several boundaries that, when detected in the audio content, result in an audio prompt. As described above, the boundaries are detected according to the list of Program headers, the list of TOC nodes within each program header and the virtual file system residing on top the these data structures. These boundaries are:

Beginning of all audio

End of all audio

Beginning of a program

End of a program

Beginning of a section

End of a section

The audio prompt indicating beginning of all audio is "Beginning of audio". This prompt is played at the beginning of all audio content. The audio prompt indicating end of all audio is "End of audio". This prompt is played when the end of all audio is reached while playing back audio content. The audio prompt for beginning of a program is "Beginning of Program". This prompt is played when the beginning of a program is reached while navigating through raw content in reverse. The audio prompt for end of a program is "End of program". This prompt is played when the end of a program is reached while navigating through raw content in the forward direction. If during audio content playback a program boundary is crossed, the title and author prompts are played automatically. Audio content playback then continues.

Optional audio prompts are the beginning of a section announcement or the end of a section announcement. The section announcements are played back when a section boundary is crossed during audio content playback. The announcements are composed of up to four audio prompts. These audio prompts are not part of the system audio prompts. Thus, as described above, the IDs for these non-system audio prompts must fall outside the range 0 to 1,023.

According to one embodiment of the present invention, the user may request title and author information. The title and author prompts are accessed through a program header data structure. This data structure contains the audio prompt IDs for the title and author. Only one ID is used for each item. The title and author prompts may be used by themselves or as part of a compound prompt such as the status prompt (described below).

According to one embodiment, the user may also request an audible listing of all stored data. When requested, the following audible indicator is heard: <program title 1> <program title 2> . . . <program title n> where n is a predetermined number. According to one embodiment, the predetermined number is 16.

According to one embodiment of the present invention, the user may play raw content, with audible announcements when section and program boundaries are encountered. If the user wishes to jump forward, and there are one or more sections in the program in the forward direction, the user is moved to the next section (according to the jump technique described above) and the section number is audibly announced (see below). For example, if the user is at the first section 402 and wishes to jump to the next section, then the user will be moved to section boundary 408. If there are no more sections forward, an audible "There are no other sections" announcement is played. The last program is marked by the last program header data structure found in the Flash. Thus, in FIG. 4, the audible announcement will be heard when the user reaches the end of stored data 400. Similarly, if the user wishes to jump backwards, and there are one or more sections in the program in the reverse direction, then the user is moved to the previous section and the section number is audibly announced. If there are no more sections in the reverse direction, the user is then returned to the beginning of the program and an audible "There are no other sections" announcement is heard.

According to another embodiment of the invention, the bookmarks are sorted in the order in which the user sets each bookmark. According to another embodiment, bookmarks are sorted in temporal order as opposed to the order in which the user sets each bookmark. When a bookmark is set by the user, the physical Flash address is stored in a serial electrically erasable programmable Read-Only Memory (serial EEPROM or SEEPROM). EEPROMs/SEEPROMs are well known to those of ordinary skill in the art. The data in the SEEPROM is sorted in temporal order. Thus, the order in which the user jumps from one bookmark to another may be different from the order in which the user set each bookmark.

In order to set a bookmark, the user selects a location and sets a mark. The mark is stored as an address in an SEEPROM, as described above. A mark and number may then be audibly announced unless no bookmarks are available. Thus, "bookmark 1" will be audibly announced when the user sets the mark. In the case where no bookmarks are available, i.e. a predetermined maximum number of marks has been reached, a "no more bookmarks" announcement may be heard instead of the previous "mark" and number announcement.

The user may also merely wish to jump to a predetermined bookmark. If for example, the user wishes to jump from bookmark 1 to bookmark 2 within stored data 400 in FIG. 4, "bookmark 2" is audibly announced when the user selects the location of "bookmark 2." If, on the other hand, the user is already at the location of bookmark 2 and wishes to jump to the "next" bookmark, then a "no marks" announcement may be heard because there are no more bookmarks in stored data 400. Alternatively, according to another embodiment, the bookmark numbers may wrap around and a "bookmark 1" announcement may be heard instead.

According to one embodiment of the present invention, all audio stored in the Flash is played back through the same set of software routines. This audio includes audio content as well as audio prompts. The software uses the prompts in Flash to create messages. All audio is read from the Flash (except the "no audio" message, which is in ROM) and decompressed by the processor. The audio is sent in digital form to a circuit that converts it to analog form, and then it is sent out either via the headphone amplifier, or the FM transmitter.

The user may also wish to jump forward or backward from one program to another. As described above, the user will be moved if there are forward or backward programs and an audible announcement will be heard. The announcement may consist of the title of the program or any other such identifying information (see below). If there is only one program, as in the example stored data 400 in FIG. 4, the user will be returned to the beginning of that program with an audible "no other programs" announcement.

Finally, the user may request a status prompt that audibly informs the user of the time remaining in the program and the program title. According to one embodiment of the present invention, the status prompt is constructed as follows: "<program title> <pause> <time played> played <pause> <time remianing> remaining." <hours> and <minutes> are filled in and may range from 0 (zero) to 59 (fifty-nine). When the user requests status, the prompt may be audibly announced. According to one embodiment, the following words are individual prompts in the audio prompt table and are used for playback, of numbers:

| | |
|---|---|
| Zero | Twelve |
| One | Thirteen |
| Two | Fourteen |
| Three | Fifteen |
| Four | Sixteen |
| Five | Seventeen |
| Six | Eighteen |
| Seven | Nineteen |
| Eight | Twenty |
| Nine | Thirty |
| Ten | Forty |
| Eleven | Fifty |

According to an embodiment of the present invention, the remaining time for a program is computed from the following parameters: the total time of the program and the elapsed time within that program. The total time is calculated by adding up the section times found in the audio descriptors for those sections. The elapsed time is calculated by adding up the section times of those sections preceding the current section. Then the position within the current section is used to lookup a time in the time-stamp table for the current section. The time-stamp table is accurate to 1 second. The remaining time is calculated by subtracting the elapsed time from the total time.

Thus, a method and apparatus for audibly indicating when a predetermined location has been encountered in stored data. The specific arrangements and methods described herein, are merely illustrative of the principles of the present invention. Numerous modifications in form and detail may be made by those of ordinary skill in the art without departing from the scope of the invention. Although this invention has been shown in relation to a particular preferred embodiment, it should not be considered so limited. Rather, the present invention is limited only by the scope of the appended claims.

We claim:

1. A method for audibly indicating when a predetermined location has been encountered in stored data, said method comprising the steps of:

identifying said predetermined location; and generating an audible indicator associated with said predetermined location when said predetermined location is encountered.

2. The method according to claim 1 wherein said predetermined location is one of an electronic bookmark, a section boundary or a program boundary.

3. A method for audibly setting an electronic bookmark in stored data, the method comprising the steps of:

selecting a location within said stored data;

associating said electronic bookmark with said location; and generating an audible message for said electronic bookmark.

4. A method for providing an audible status identifier for locations within stored data, said method comprising the steps of:

receiving a status request;

processing said status request to identify said locations within said stored data; and generating said audible status identifier wherein said audible status identifier is associated with and identifies said locations within said stored data.

5. An apparatus for providing an audible status identifier for locations within stored data, said apparatus comprising:

a storage unit for storing said stored data;

a processing unit for processing a status request to determine said locations within said stored data; and a playback unit for enabling said audible status identifier when said locations are encountered within said stored data, wherein said status identifier is associated with said locations.

6. A method for providing audible indications while navigating through data stored in a portable, hand held data storage and playback device, said method comprising the steps of:

identifying locations within said data;

associating said audible indications with each of said locations; and enabling said audible indicators to be activated when each of said locations is encountered while navigating through said data.

* * * * *